United States Patent [19]

Sueoka et al.

[11] Patent Number: 4,486,768
[45] Date of Patent: Dec. 4, 1984

[54] AMPLIFIED GATE TURN-OFF THYRISTOR

[75] Inventors: Tetsuro Sueoka, Numazu; Satoshi Ishibashi, Higashimine, both of Japan

[73] Assignee: Kabushiki Kaisha Meidensha, Japan

[21] Appl. No.: 526,796

[22] Filed: Aug. 26, 1983

Related U.S. Application Data

[63] Continuation of Ser. No. 295,484, Aug. 24, 1981, abandoned, which is a continuation of Ser. No. 105,306, Dec. 19, 1979, abandoned.

[30] Foreign Application Priority Data

Jan. 12, 1979 [JP] Japan ..................... 54-2364

[51] Int. Cl.³ .............................. H01K 29/74
[52] U.S. Cl. ........................ 357/38; 357/20; 357/86; 307/252 A; 307/252 C; 307/252 K; 307/305
[58] Field of Search ............... 357/38, 20, 86; 307/252 A, 252 C, 252 J, 252 K, 305

[56] References Cited

U.S. PATENT DOCUMENTS

| | | | |
|---|---|---|---|
| 3,544,818 | 12/1970 | Harris | 307/252 J |
| 4,092,703 | 5/1978 | Sueoka et al. | 357/86 |
| 4,110,638 | 8/1978 | Voss | 307/252 A |
| 4,115,707 | 9/1978 | Kalfus | 307/252 C |
| 4,217,504 | 8/1980 | Fullmann et al. | 307/252 C |
| 4,255,675 | 3/1981 | Lehmann et al. | 357/38 |
| 4,315,274 | 2/1982 | Fukui et al. | 357/38 |

Primary Examiner—Joseph E. Clawson, Jr.
Attorney, Agent, or Firm—McGlew and Tuttle

[57] ABSTRACT

A gate controlled semiconductor device is provided having a main electrode member consisting of a cathode electrode assembly formed in one end layer of a wafer of semiconductive material and an anode electrode assembly formed in other end layer of said wafer, a main thyristor portion, an auxiliary thyristor portion and a bias controlling member. Said main thyristor portion is constructed by at least one control electrode assembly which is provided in the vicinity of the cathode electrode assembly of the main electrode member. Said auxiliary thyristor portion includes an additional layer which is provided on the one layer of the wafer and being adjacent to the cathode electrode assembly and the auxiliary thyristor portion is forcedly switched on and off by said bias controlling member.

5 Claims, 10 Drawing Figures

AMPLIFIED GATE TURN-OFF THYRISTOR

This is a continuation of application Ser. No. 295,484 filed Aug. 24, 1981, which is a continuation of Ser. No. 105,306 filed Dec. 19, 1979, now both abandoned.

The present invention relates to a semiconductor device, and more particularly to an improvement of the gate construction of a gate controlled semiconductive device in the form of a gate turn-off thyristor which is able to turn on and off the current which flows in a main circuit.

A gate controlled semiconductor device such as, for example, a gate turn-off thyristor is constructed similar to a usual reverse-blocking three-terminal thyristor. The gate turn-off thyristor is, however, switched from the non-conductive state to conductive state by supplying a current to a gate electrode thereof, and thereby the main current flows through the gate turn-off thyristor. In order to change the thyristor to the non-conductive state from the conductive state, the main current must be made zero for some predetermined time interval by some external means. The gate turn-off thyristor may then be returned to the non-conductive state from the conductive state by supplying a negative current, which is a current flowing in the reverse direction to reverse-bias a cathode junction. The gating current of the gate turn-off thyristor is, however, from ten to one hundred times that of the usual power thyristor, if the gate turn-off thyristor is used as a power switch. Accordingly, there are various defects in the gate turn-off thyristor, in that a control circuit for controlling the gate current requires a large capacity and the control circuit becomes complicated and expensive, since the large gating current is required in order to fire the gate turn-off thyristor.

To improve the gating current sensitivity, a thyristor having an amplifying function is proposed. The amplifying function, however, operates only when the thyristor is fired. On the other hand, the gate current to be supplied to the gate electrode of the gate turn-off thyristor may be made small by applying an amplifying function to the gate turn-off thyristor, as in the case of the usual power thyristor. There is, however, the serious defect that the amplifying function has an adverse affect and thereby the turn-on time of the gate turn-off thyristor is long. Consequently, there is an urgent need to improve the gating sensitivity of the gate turn-off thyristor, without impairing its turn-off operation.

FIGS. 1 and 2 show a typical prior art gate controlled semiconductor device in the form of a gate turn-off thyristor. Note that the dimensions of the figures are exaggerated in order to explain the conceptual structure. In the gate turn-off thyristor shown in FIGS. 1 and 2, a silicon wafer 1 is constructed with a $P_1$ layer 2, an $N_1$ layer 3, a $P_2$ layer 4, an $N_2$ layer 5 and an $N_3$ layer 6. Each of the layers $P_1$, $N_1$ and $N_2$ was manufactured by a usual method. First, a weakly N-type silicon wafer was prepared. Next, $P_1$ and $P_2$ layers were grown over each of the end surfaces of the wafer by diffusing gallium. After that a plurality of cathode layers $N_2$ and an $N_3$ layer were formed by diffusing phosphorus to a given depth. Next an aluminum layer was evaporated to form an ohmic electrode. The pattern of the $N_2$ layers 5 and the $N_3$ layer can also take the form of involute curves, a comb-shape and so on.

As is shown in FIG. 1, a comb-shaped groove 12 is formed to a given depth on a surface of the $P_2$ layer 4 so as to be opposed to the $N_2$ layers 5 each of which is aligned with the length direction of the wafer 1 and spaced apart from other. A comb-shaped metallic layer 8 is arranged in the bottom of the groove 12 to constitute a second gate electrode assembly $G_2$. A metallic layer 10 is arranged on a surface of the $N_3$ layer 6 so as to shortcircuit the $P_2$ layer 4 and the $N_3$ layer 6. Metallic layers 9 are arranged on the $N_2$ layers 5 and a bridging electrode (not shown in the drawings) must be mounted on the metallic layers 9 to form a cathode electrode assembly K. A metallic layer 7 is provided on the exposed surface of the $P_2$ layer 4 in order to constitute a first gate electrode assembly $G_1$, and a metallic layer 11 is arranged on the $P_1$ layer to form an anode electrode assembly A.

The gate turn-off thyristor shown in FIGS. 1 and 2 consists of a main thyristor portion M including the $P_1$ layer 2, the $N_1$ layer 3, the $P_2$ layer 4 and the $N_2$ layer 5 and an auxiliary thyristor portion S including the $P_1$ layer 2, the $N_1$ layer 3, the $P_2$ layer 4 and the $N_3$ layer 6. Additionally a control power source 13 is connected between the cathode electrode assembly K and the second gate electrode assembly $G_2$ by way of a switch element 14.

In the prior art device shown in FIGS. 1 and 2, when a gate current is supplied between the first gate electrode assembly $G_1$ and the cathode electrode assembly K under the condition that the forward biasing voltage is applied between the anode electrode assembly A and the cathode electrode assembly K, the auxiliary thyristor portion S is initially fired, and thereby the amplified current flows from the metallic layer 10 to the $N_2$ layers 5. By the amplified current flowing in the $N_2$ layers 5, the main thyristor portion M is fired.

The switch 14 is closed in order to turn off the main thyristor portion M, and thereby the reverse current flows from the control power source 13 by way of the switch 14, the metallic layers 9, the $N_2$ layers 5 and the metallic layer 8 of the second gate electrode assembly $G_2$.

By the current from the control power source 13, the inverse withstand voltage of the $N_2P_2$ junction is recovered, and the current flowing in the main thyristor portion M is interrupted. In this case, a junction between the $N_3$ layer 6 and the $P_2$ layer 4 cannot be returned to the non-conductive state when the auxiliary thyristor portion S is conducting, because the voltage of the control power source 13 is applied only to the junctions of the $N_2$ layers 5 and the $P_2$ layer 4. Accordingly, the main thyristor portion M cannot be turned off so long as the auxiliary thyristor member S is conductive, due to the current supplied to the junction of the $N_2$ layer 5 and the $P_2$ layer 4. Under these conditions, a concentration of current occurs at the $N_2P_2$ junction in the vicinity of the $N_3$ layer 6 and, as a result, the $N_2P_2$ junction is thermally destroyed.

According to the prior art device of FIGS. 1 and 2 it is, accordingly, necessary to switch off the switch 14 in order to turn off the main thyristor portion M, after the confirmation of the nonconducting state of the auxiliary thyristor portion S. The off-operation of the auxiliary thyristor S may be performed by constructing it so that the voltage drop in the auxiliary thyristor portion S is greater than that of the main thyristor portion M. To achieve this, there are several methods, one of which is to make the lifetime of the auxiliary thyristor S short in comparison with that of the main thyristor portion M by increasing the concentration of gold diffusion in the auxiliary thyristor S compared with that of the main thyristor portion M.

Another method for increasing the voltage drop of the auxiliary thyristor S is to make the resistance of a region between the metallic layer 10 and metallic layer 9 small by etching the exposed surface of the $P_2$ layer 4. A gate turn-off thyristor is often used in a main circuit of an inverter apparatus, particularly when a motor is used as a load of the apparatus employing the gate turn-off thyristor, and then the gating current must be supplied continuously to the gate electrode of the gate turn-off thyristor both while conductive and while non-conductive. In particular, a gating current having the same pulse width as a load current must be supplied to the gate turn-off thyristor in order to maintain the conductive state thereof. When turning off the gate turn-off thyristor, the control switch 14 must, therefore, be switched on after a time interval, which corresponds to the time interval required to turn off the auxiliary thyristor portion S, in order to interrupt the main current of the gate turn-off thyristor. A complicated operation is, accordingly, required to operate the circuit, and therefore a gate turn-off thyristor is not applicable for use as a switching element in high frequency operation, since the turn-off time becomes long.

It is an object of the present invention to provide a new and improved gate controlled semiconductor device having an amplifying function in gate firing, which can be turned off by supplying a reverse-biasing signal to an auxiliary thyristor portion S and at the same time to a main thyristor portion M.

It is another object of the present invention to provide a gate turn-off thyristor which allows a high rate of current rise di/dt.

It is a further object of the invention to provide a gate turn-off thyristor in which the turn-off time is rendered short.

It is a still further object of the present invention to provide a gate controlled semiconductor device whose construction allows the above objects and functions to be achieved easily.

In accordance with the present invention, there is provided a gate controlled semiconductor device comprising a main electrode member consisting of a cathode electrode assembly formed in one end layer of a wafer of semiconductive material including four-semiconductive layers and an anode electrode assembly formed in other end layer of said wafer, a main thyristor portion having at least one control electrode assembly provided in the vicinity of the cathode electrode assembly of the main electrode member, an auxiliary thyristor portion including an additional layer provided on said one layer of the wafer and being adjacent to said cathode electrode assembly and having a different polarity from said one end layer of the wafer, and a bias controlling member for forcedly switching on and off said auxiliary thyristor portion.

The invention will now be described with reference to the accompanying drawings in which.

DESCRIPTION OF THE PREFERRED EMBODIMENTS

Figure 1:
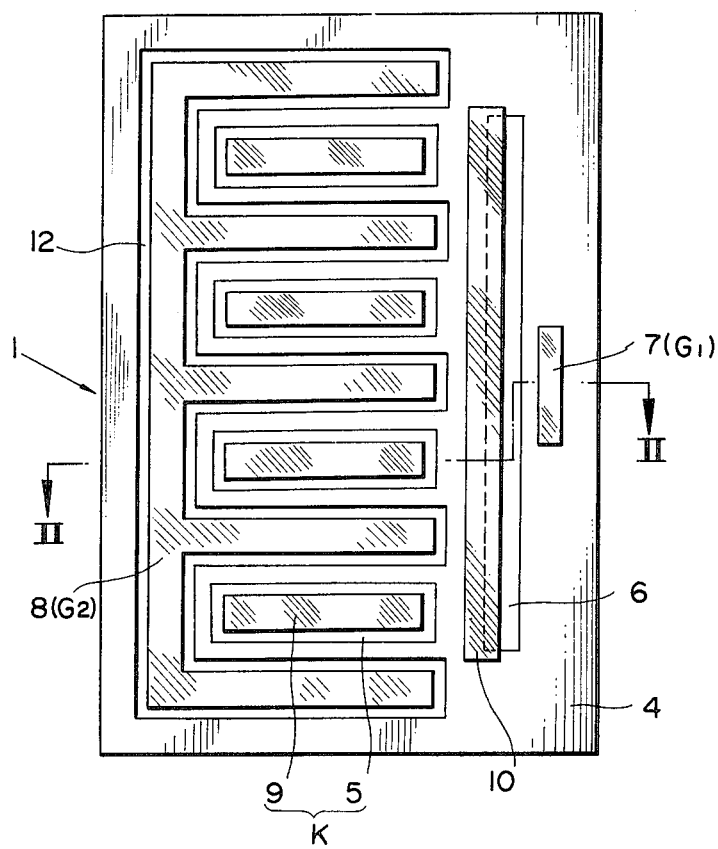
FIG. 1 is a plan view of a prior art type of gate controlled semiconductor device.
Figure 2:
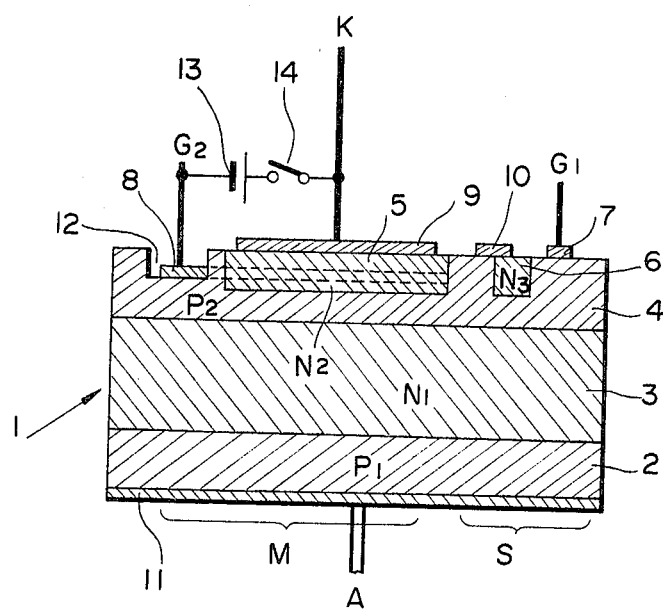
FIG. 2 is a sectional view taken along line II—II of FIG. 1.
Figure 3:
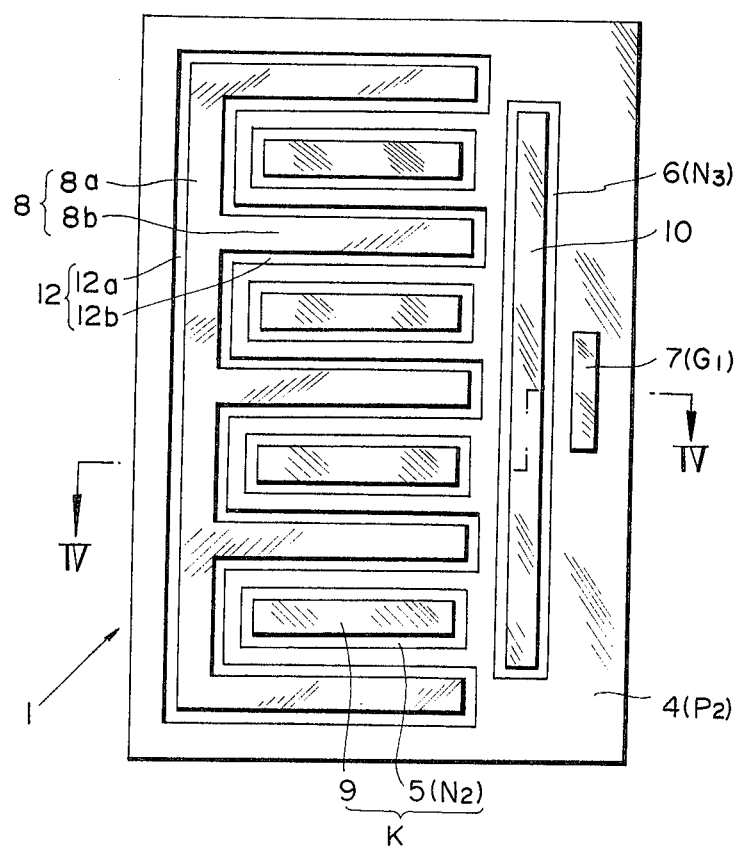
FIG. 3 is a plan view of a first embodiment of the gate controlled semiconductor device in accordance with the present invention.
Figure 4:
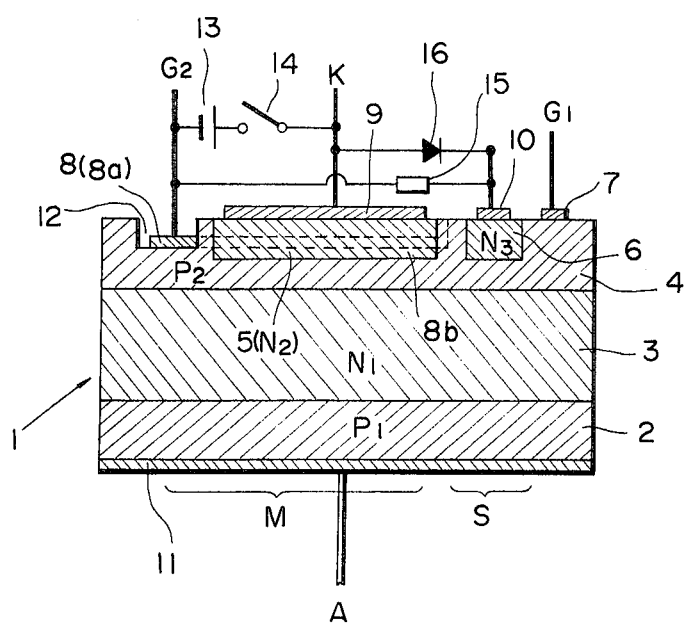
FIG. 4 is a sectional view taken along line IV—IV in FIG. 3.

FIGS. 3 and 4 show a first embodiment of the gate controlled semiconductor device according to the present invention. As in the prior art device shown in FIGS. 1 and 2, a cuboid wafer 1 includes a bulk N, layer 3 which is weakly N-type. A $P_1$ layer 2, which is a P-type diffused region, a $P_2$ layer 4 and a plurality of $N_2$ layers 5 form with the bulk $N_1$ layer 3 a main thyristor portion M. An $N_3$ layer 6 is then further provided in the surface of the $P_2$ layer 4 to form an auxiliary thyristor portion S. In this embodiment a plurality of $N_2$ layers 5 are spaced evenly along the length of the wafer 1.

Metallic layers 9 are mounted on the $N_2$ layers 5 to form a cathode electrode assembly K. A comb-shaped groove 12 is provided on the surface of the $P_2$ layer 4. The groove 12 consists of a bridging portion 12a along one side of the $P_2$ layer 4 and a plurality of projections 12b extending from the bridging portion 12a toward the other side of the $P_2$ layer 4, interlaced with the $N_2$ layers 5. A metallic layer 7 is provided at the opposite side of the surface of the $P_2$ layer 4 to the cathode electrode assembly K, to form a first gate electrode assembly $G_1$. A metallic layer 8 is disposed in the bottom portion of the groove 12 to form a second gate electrode assembly $G_2$. The metallic layer 8 is composed of a bridging segment 8a and a plurality of projections 8b extending from the bridging segment 8a around the $N_2$ layers 5. The $N_3$ layer 6 is provided in the $P_2$ layer 4 so as to be between the cathode electrode assembly K and the first gate electrode assembly $G_1$, and a metallic electrode 10 is provided on the surface of the $N_3$ layer 6.

As is shown in FIG. 4, an external resistor 15 is connected between the first gate electrode assembly $G_1$ and the electrode 10 so that the current through the auxiliary thyristor portion S flows through the bridging segment 8a and the projection 8b of the metallic layer 8 and the junction of the $P_2$ layer 4 and the $N_2$ layer 5 of the main thyristor portion M. A blocking diode 16 is connected between the cathode electrode assembly K and the electrode 10 so that a current can flow from the cathode electrode assembly K to the electrode 10, but not in the reverse direction. A reverse biasing voltage is applied to the $P_2N_2$ junction of the main thyristor portion M and is also applied, at the same time, to the $P_2N_3$ junction of the auxiliary thyristor S. Namely, the electrode 10 is arranged on the exposed surface of the $N_3$ layer 6 which constitutes the auxiliary thyristor S so as not to be short-circuited to the $P_2$ layer 4, and the external resistor 15 is connected between the metallic layer 8 arranged on the $P_2$ layer 4 and the electrode 10. The diode 16 is interposed between the cathode electrode assembly K and the electrode 10 to prevent a current from flowing from the $N_3$ layer 6 to the cathode electrode assembly K of the main thyristor portion M. A control electrode member is formed by the first gate electrode assembly $G_1$ and the second gate electrode assembly $G_2$. A main electrode is comprised by the anode electrode assembly A and the cathode electrode assembly K. A bias control member includes the control power 13, the switch element 14, the resistor 15 and the diode 16.

A device of the kind described above was made essentially as follows.

First, an N-type silicon wafer having resistivity of the order of 50–60 Ω-cm was prepared. The layers $P_1$, $N_1$ and $P_2$ were formed by diffusing Gallium at a temperature of about 1250° C. by a closed tube diffusion method. In this case, the diffusion depths that is the thicknesses of the $P_1$ layer and $P_2$ layer were 50 μm and the surface densities of the $P_1$ layer and $P_2$ layer were of the order of $1 \times 10^{18}$ atoms/cm$^3$. Oxide films were arranged over both surfaces of the wafer, and thereafter the oxide film arranged on a surface of the $P_2$ layer was partially removed in order to form a predetermined diffusion pattern. $N_2$ layers and an $N_3$ layer were formed by the selective diffusion of phosphor to regions in which the oxide film was removed so that the surface density was in the order of $1 \times 10^{20}$ atoms/cm$^3$ and the diffusion depth was 15 micron. Further, the carrier lifetime in the $N_1$ layer was adjusted so as to be a given value by making the gold diffusion from the $P_1$ layer side thereto. Next, a portion of the $P_2$ layer which surrounds the $N_2$ layers was engraved to a depth ranging from 20 to 30 μm by etching in order to provide a metallic layer 8 spaced apart from the metallic layers 9. Then, the unused portions were removed after evaporating aluminum over the whole surface of the side of the cathode, in order to constitute the electrodes 7, 8, 9 and 10. A thermal compensating body in the form of a tungsten plate was arranged on the $P_1$ layer by alloyed junction by employing the aluminum, and surface stabilization was performed by a beveling process, etching treatment and by varnishing treatment on the peripheral portion of the wafer in order to obtain the forward and reverse breakdown voltages.

The junction of the resistor 15 and the diode 16 can be formed in the outer portion of an enclosing casing and it is also possible to incorporate the resistor 15 and the diode 16 in to a recess provided in a copper post to be contacted with the metallic layer 9 of the cathode electrode assembly. Moreover, it is possible to arrange that the metallic layer 8b is in the vicinity of and/or in the $N_3$ layer in order to make the turn-off operation of the auxiliary thyristor portion S certain.

Additionally, although a side-gate construction is shown in the above described embodiment, it should be noted that the present invention is not to be limited to this and modifications can be obtained in accordance with requirements.

In operation, when a gating current is supplied between the first gate electrode assembly $G_1$ for turning on the device and the cathode electrode assembly K, under the condition that a forward bias voltage is applied between the anode electrode assembly A and the cathode electrode assembly K, the auxiliary thyristor portion S is fired and thereby a current flows in the auxiliary thyristor portion S from the anode electrode assembly A to the electrode 10. The current of the auxiliary thyristor portion S flows in a current loop formed by the metallic layer 8, the $P_2$ layer 4, the $N_2$ layer 5 and the cathode electrode assembly K. The amount of current flowing in the $N_3$ layer 6 is decided by the external resistor 15 and another external resistor (not shown in the drawing). In this case, it is possible to select a junction area of the $N_3$ layer so that the current density is of the order of 2 to 10 amperes per square centimeter, and to set the resistance value of the external resistor 15 so that the current density of the current flowing from the $P_2$ layer 4 to the $N_2$ layers 5 is from 1 to 5 A/cm$^2$.

The current which flows in the $N_2$ layers 5 fires all regions of the side surface of the $N_2$ layers 5 in the vicinity of the metallic layer 8 of the second gate electrode $G_2$, and thereafter the main thyristor M which consists of layers $P_1$, $N_1$, $P_2$ and $N_2$ becomes conductive due to the transmission of the current which has flowed in the $N_3$ layer 6 to the $N_2$ layers 5.

When turning off the main thyristor portion M, the reversebias voltage is applied to the second gate electrode assembly $G_2$ by way of the $N_2$ layers 5 and the $P_2$ layer 4 from the control power source 13 by the closure of the control switch 14, after interrupting the current which flows from the external portion to the first gate electrode assembly $G_1$. The auxiliary thyristor portion S is also turned off simultaneously, since a reverse biasing voltage is applied by the aid of the diode 16 through a loop formed by way of the $N_3$ layer 6-the $P_2$ layer 4-the second gate electrode assembly $G_2$.

In accordance with the above described gate turn-off thyristor, the following experimental data was obtained. Each junction layer and each electrode assembly was manufactured by the same method as for the prior art device. The dielectric strength was of the order of 1200 volts, and the external resistor 15 was of the order of 20 ohms for a gate turn-off thyristor with a capacity for the gate interrupting current of 500 amperes. A 20 volt power source 13 and a diode 16 whose current capacity was of the order of 3 amperes were used, and for the switch 14 a high speed switching transistor was adopted. Under these conditions, the gate turn-off thyristor was fired by supplying a gate current for from 1 to 6 microsecond S, and a sufficient area of the $N_2$ layers was fired. It was confirmed that the device was turned off within the turnoff time of the order of 5 microseconds, with a load current of 500 amperes, even if, at the turn-off time, switch 14 is turned on at the same time as the current through the first gate electrode $G_1$ is turned off. In this case, the turnoff time of the gate turn-off thyristor is almost equal to that in the condition that the $N_3$ layer is made completely nonconducting.

According to the gate controlled semiconductor device in FIGS. 3 and 4, the gating current can be reduced to the order from 0.1 amperes to 0.5 amperes by the aid of the auxiliary thyristor portion S, and further it is unnecessary to leave a delay time between a firing signal and a turning off signal. Accordingly, an excess current can be interrupted by supplying an off signal immediately after the firing signal is applied to the gate turn-off thyristor before the current flows thereto, and therefore the construction of the control circuit can be simplified. Moreover, the device of the present invention does not require a current-limiting reactor, although the prior art device requires the current-limiting reactor in order to restrict the rise of the current within the time delay interval between the firing signal and the OFF signal.

Figure 5:
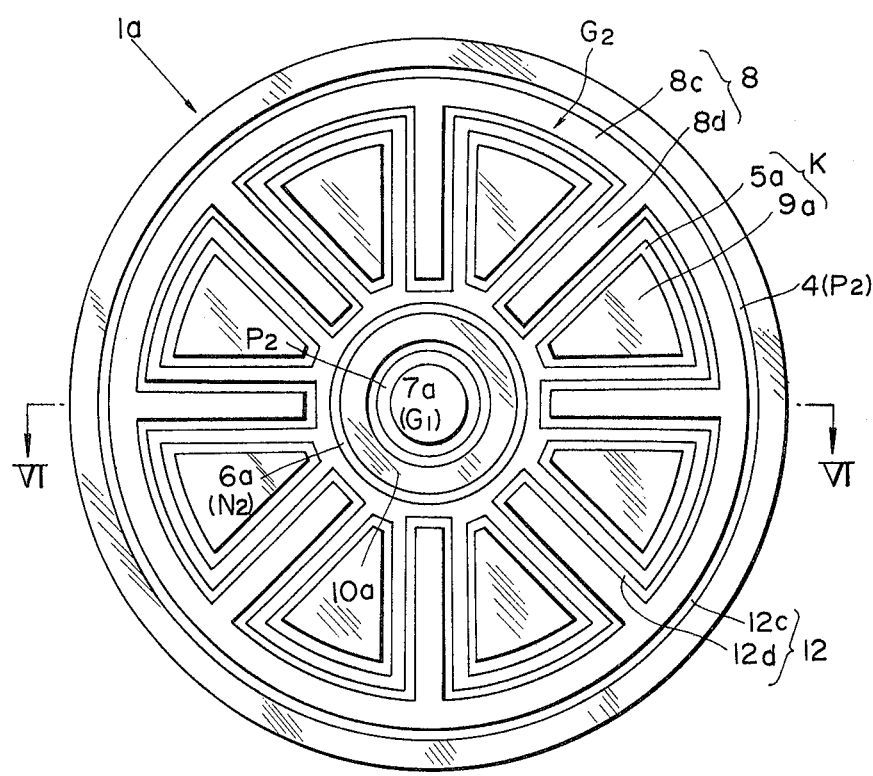
FIG. 5 is a plan view of a modification of the semiconductor device shown in FIGS. 3 and 4.
Figure 6:
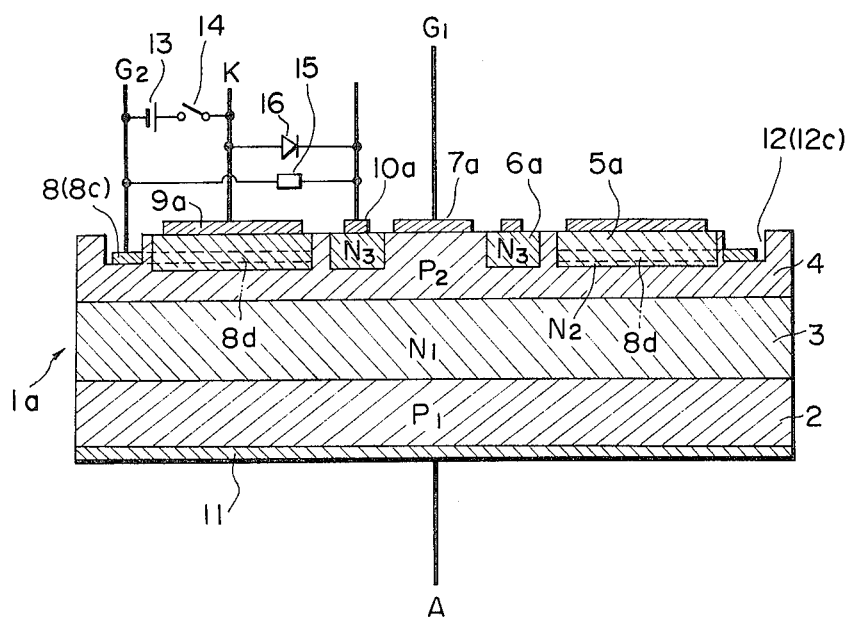
FIG. 6 is a sectional view taken along the line VI—VI in FIG. 5.

FIGS. 5 and 6 shows a modification of the gate turn-off thyristor shown in FIGS. 3 and 4. As is best shown in FIGS. 5 and 6, a wafer 1a is formed in a disc shape. A disc-shaped metallic layer 7a is arranged on a center portion of an exposed surface of the $P_2$ layer 4 of the wafer 1a to form a first gate electrode $G_1$ of the control electrode member. An annular groove 12c is provided on the outer edge of the exposed surface of the $P_2$ layer 4 in order to form the bridging portion, and a plurality of radial slots 12d are provided so as to communicate with the groove 12c and so as to extend therefrom toward the center portion of the wafer 1a. A metallic layer 8 is arranged in the bottom portion of the groove 12, and the metallic layer 8 consists of a circular bridging segment 8c arranged in the bottom of the groove 12c and a plurality of projections 8d projecting from the bridging segment 8c toward the center portion of the wafer 1a to form a second gate electrode assembly $G_2$.

Further, a plurality of sector-shaped $N_2$ layers 5a are provided between adjacent projecting recesses 12d and are spaced apart at a predetermined distance from each other. A plurality of sector-shaped metallic layers 9a are also arranged on the $N_2$ layers 5a so as to constitute a cathode electrode assembly K. A ring-shaped $N_3$ layer 6a is provided coaxially around the first gate electrode assembly $G_1$, spaced and localized between the first gate electrode assembly $G_1$ and the cathode electrode assembly K, and a ring-shaped metallic layer in the form of an auxiliary electrode 10a to form an auxiliary thyristor S. Thus, as with FIGS. 3 and 4, second gate $G_2$ is provided on a side of the auxiliary cathode layer $N_3$ which is opposite the first gate electrode $G_1$. The main cathode layer $N_2$ is also substantially surrounded by the second gate $G_2$, specifically projections 8d with bridging segments 8c. Main cathode layer $N_2$ is surrounded except for a portion thereof which faces the auxiliary layer $N_3$ as shown in FIGS. 5 and 6.

Figure 7:
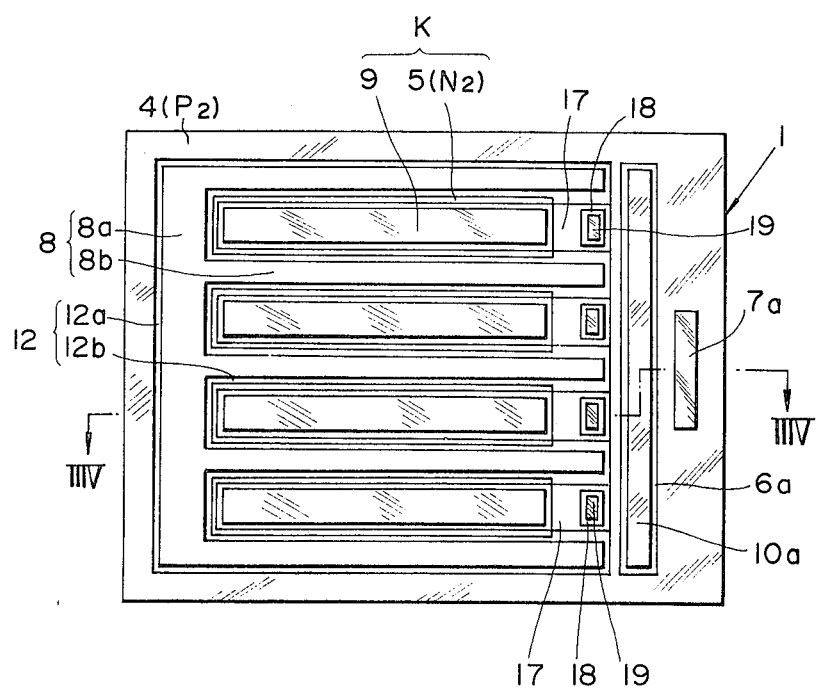
FIG. 7 is a plan view of a second embodiment of the gate controlled semiconductor device in accordance with the present invention.
Figure 8:
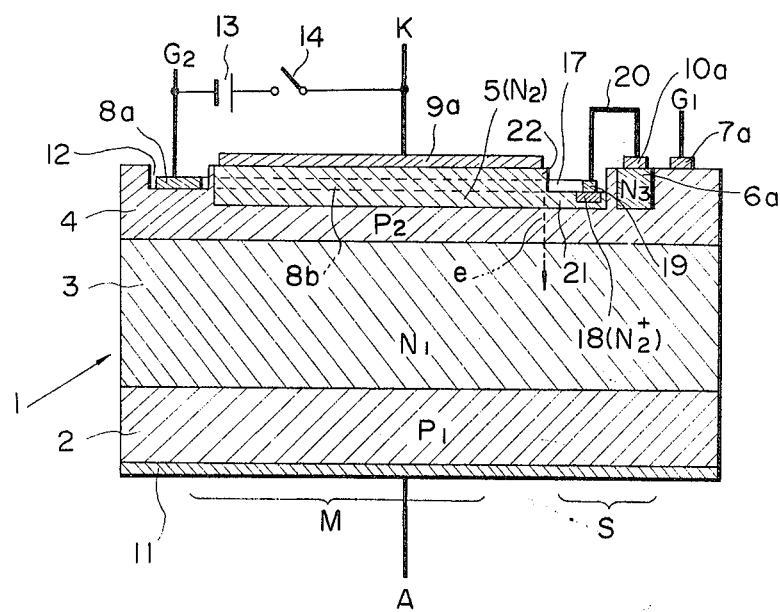
FIG. 8 is a sectional view taken along the line VIII—VIII of FIG. 7.

FIGS. 7 and 8 illustrate a gate turn-off thyristor which also employs the present invention. This gate turn-off thyristor includes a plurality of grooves 17 which are provided on the surfaces of $N_2$ layers 5 adjacent to an $N_3$ layer 6a, a plurality of high density impurity regions 18 which are provided in the $N_2$ layers 5 located in the grooves 17, a plurality of metallic layers 19 which are arranged on the high density impurity regions 18 and leads 20 which connect the high density impurity regions 18 to the $N_3$ layers 10a.

In more detail, a cuboid wafer 1 is composed of a $P_1$ layer 2, an $N_1$ layer 3, $P_2$ layer 4 and a plurality of rectangular-shaped $N_2$ layers 5 provided on the surface of the $P_2$ layer 4, spaced at a predetermined distance from each along the length direction of the wafer 1. A comb-shaped groove 12 is provided on the surface of the $P_2$ layer 4. The groove 12 consists of a bridging portion 12a located to one side of the surface of the $N_2$ layer 5 so as to extend along the length direction and a plurality of extending portions 12b extending from the bridging portion 12a toward the other side of the $P_2$ layer 4, along with the $N_2$ layer 5. A metallic layer 8 is arranged in the groove 12 which consists of a bridging segment 8a arranged in the bridging portion 8b and a plurality of extensions 12b extending from the bridging segment 8a toward the $N_3$ layer 6a. A metallic layer 7a is arranged on the other side surface of the $P_2$ layer 4 to form a first gate electrode assembly $G_1$. An $N_3$ layer 6a is provided on the surface of the $P_2$ layer 4 adjacent to the first gate electrode $G_1$ along the length of the wafer 1, and a metallic layer 10a is arranged on the $N_3$ layer 6a to form an auxiliary thyristor S. A plurality of grooves 17 is formed in the surfaces of the $N_2$ layers 5 in between the $N_2$ layers of the cathode electrode K and the $N_3$ layer 6a. A plurality of high density impurity regions 18 is formed in the bottom surfaces of the grooves 17. A plurality of aluminum electrodes 19 are arranged on the regions 18, and the electrodes 19 are each connected to the electrode 10a by the leads 20.

In the gate turn-off thyristor described above, a portion of the cathode $N_2$ layer located to the side of the $N_3$ layer 6a is removed at the predetermined shape and to a given depth by an etching method to form the grooves 17. High density impurity regions 18 are formd by diffusing phosporus into the bottom surface of the grooves 17 in order to provide an ohmic connection. The aluminum electrodes 19 are constructed temporarily with the metallic layers 7a, 9, 10a and 8, and thereafter the each of the electrodes 19 is connected to the electrode 10a by the lead 20.

In the device of FIGS. 7 and 8, the auxiliary thyristor portion S is fired by supplying a firing gate current to the first gate electrode assembly $G_1$ under the condition that the forward biasing voltage is applied between the anode electrode assembly A and the cathode electrode assembly K. When the auxiliary thyristor portion S is fired, a current flows from the electrodes 19 to the metallic layer 9 by way of low resistance regions 18, the low resistance portion of the $N_2$ layer 5, the high resistance regions 21 and the $N_2$ layers 5. The high resistance regions 21 are formed by etching the surface of the $N_2$ layers 5. Accordingly, the current from the $N_3$ layer 6a biases forwardly the cathode-emitter layers which are junctions of the $N_2$ layers 5 and the $P_2$ layer 4, due to the voltage drop in the low resistance regions 21. The voltage drop in the cathode-emitter layers causes the injection of electrons e, and thereby the main thyristor portion M including the $N_2$ layers 5 is fired and thereby the resistor regions 21 and end portions 22 of the metallic layers 9a are initially fired as the initial firing regions.

When turning off the main thyristor portion M of the gate turn-off thyristor, the bias control switch 14 is closed. By closure of the switch 14, a reverse bias voltage is applied to the $N_2P_2$ junctions from the bias control power source 13 in order to turn off the main thyristor portion M and, in this case, the $N_3P_2$ junctions are also reversely biased by the voltage drops due to the high resistor portions 21. By application of the reversing bias applied to the $N_3P_2$ junction, the auxiliary thyristor portion S is made non-conducting.

In the gate turn-off thyristor shown in FIGS. 7 and 8, although the high resistance regions 21 are constructed by providing the grooves 17 in the $N_2$ layers 5 adjacent to the $N_3$ layer it is apparent, in accordance with the present invention, that the high resistance regions 21 can be provided on the portions of the $N_2$ layers which are located at the opposite side of to the metallic layers 9.

Figure 9:
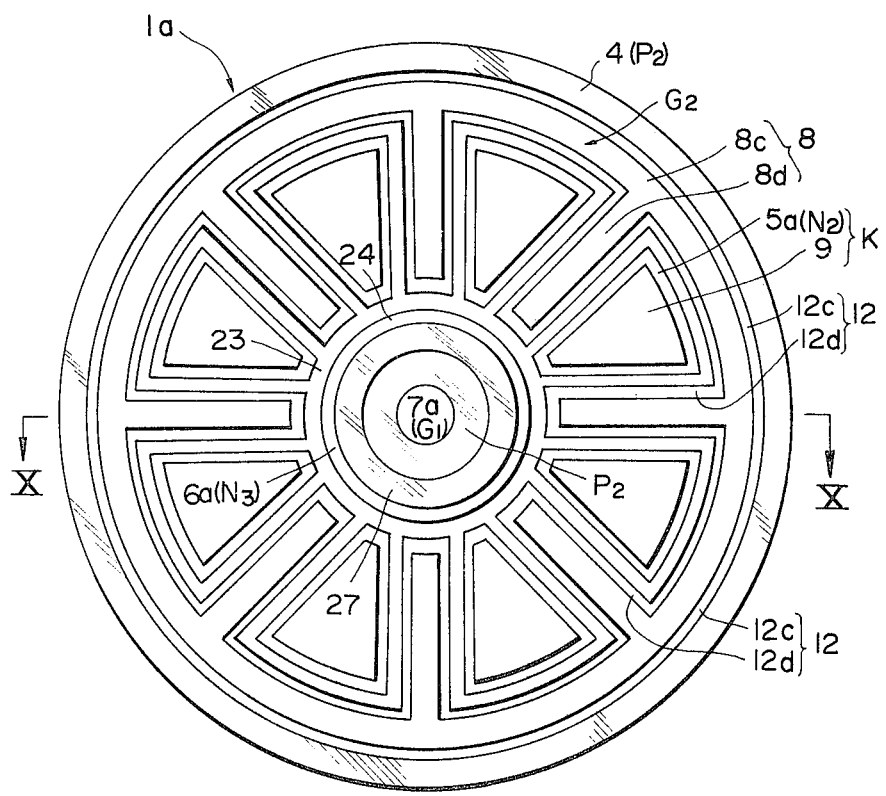
FIG. 9 is a top plain view of a gate controlled semiconductor device of the third embodiment in accordance with the present invention.
Figure 10:
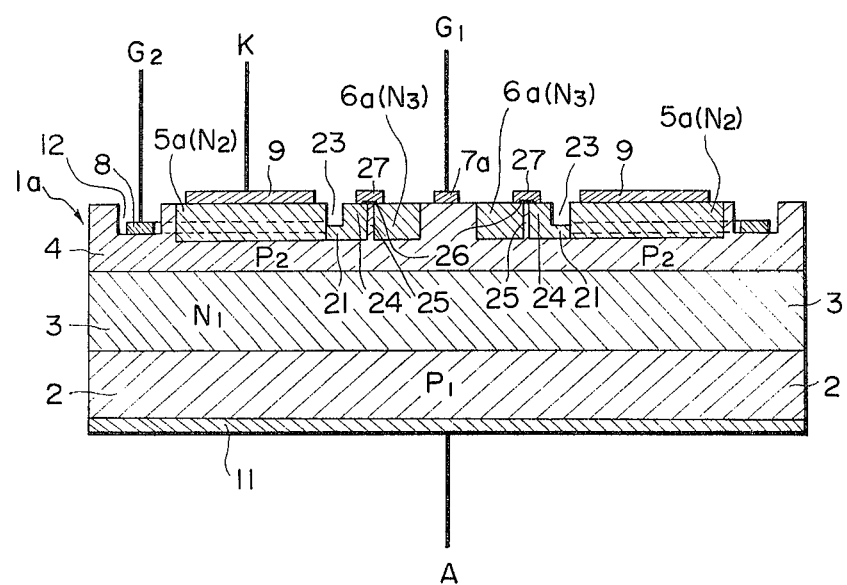
FIG. 10 is a cross-sectional view of FIG. 9 taken along the line X—X in FIG. 9.

FIGS. 9 and 10 illustrate another gate controlled semiconductor device embodying the present invention. In the gate turn-off thyristor shown in FIGS. 9 and 10, a disc-shaped wafer 1a also comprises a $P_1$ layer 2, an $N_1$ layer 3, a $P_2$ layer 4 and a plurality of $N_2$ layers 5a provided on an exposed surface of the $P_2$ layer 4. A groove 12 is provided on the surface of the $P_2$ layer 4. The groove 12 consists of a circular bridging portion 12c provided on the periphery of the $P_2$ layer 4 and a plurality of extensions 12d extending radially toward a center portion of the $P_2$ layer 4. The plurality of $N_2$ layers 5a are formed in sector shapes on the $P_2$ layer 4 along the groove 12.

In the gate turn-off thyristor of FIGS. 9 and 10, the diffused regions 18 (see FIGS. 7 and 8) for ohmic adhesion to the aluminum electrode 19, and the lead 20 unnecessary. Accordingly, a recess 23 is formed in a portion of the $N_2$ layer 5a by etching method to form a desired resistor region 21. An insulating material in the form of an oxide film 26 is mounted over the surfaces of the $N_3$ layer 6a, partial regions 24 of the $N_2$ layers 5a and a portion of the $P_2$ layer 4 which is located between the $N_2$ layers 5a and the $N_3$ layer 6a. A ring-shaped electrode 27 is mounted on the surface of the $N_3$ layer 6a, region 24, in order to electrically connect the $N_3$ layer 6a to the $N_2$ layers 5a. It is appreciated that, according to the gate turn-off thyristor of FIGS. 9 and 10, similar operations and advantages to that of the device shown in FIGS. 3 and 4 are obtained.

As explained with reference to the above various embodiments, in the gate controlled semiconductor device in accordance with the present invention, the auxiliary thyristor portion can be controlled instantaneously when the gating current is interrupted in turning off the gate controlled semiconductor device. Accordingly, it should be apparent that the following advantages are obtained.

(1) The ON sensitivity of the device is extremely improved in comparison with prior art devices.

(2) The gate turn-off thyristor obtained by the present invention is inexpensive and widely applicable to a high-frequency load and to a high transient current load, since the turn-on and turn-off time are shortened in comparison with a conventional gate turn-off thyristor.

(3) An economical gate turn-off thyristor of good characteristics can be obtained, since the current rise (di/dt) is large.

(4) Since it is not necessary to decrease the junction area, a high performance device is obtained without decreasing its current capacity.

It is to be understood that the embodiments described in detail are only illustrative of the general principles involved; other embodiments may be devised consistent with the spirit and within the scope of the invention.

What is claimed is:

1. A gate controlled semiconductor device comprising:

a semiconductor bulk layer ($N_1$) of one conductivity type;

a first semiconductor layer ($P_1$) of other conductivity type connected to one side of said bulk layer;

a second semiconductor layer ($P_2$) of other conductivity type connected to an opposite side of said bulk layer and having an exposed surface;

an anode electrode (A) connected to said first layer;

a semiconductor main cathode emitter layer ($N_2$) of said one conductivity type disposed in said second layer ($P_2$) and having an exposed surface;

a semiconductor auxiliary cathode emitter layer ($N_3$) of said one conductivity type disposed in said second layer ($P_2$), spaced from and facing said main cathode emitter layer ($N_2$) and having an exposed surface;

an auxiliary electrode (10) provided on said exposed surface of said auxiliary cathode emitter layer ($N_3$) and out of contact with said second layer ($P_2$);

a cathode electrode (K) connected to said exposed surface of said main cathode emitter layer ($N_2$);

a first gate electrode ($G_1$) connected to said second layer ($P_2$) on a side of said auxiliary electrode opposite said cathode electrode and in the vicinity of said auxiliary cathode emitter layer ($N_3$);

a second gate electrode ($G_2$) provided on said exposed surface of said second layer ($P_2$) on a side of said auxiliary electrode opposite said first gate electrode and so as to surround said main cathode emitter layer ($N_2$) except for a portion of said main cathode emitter layer facing said auxiliary cathode emitter layer ($N_3$);

said bulk ($N_1$), first ($P_1$), second ($P_2$) and main cathode emitter ($N_2$) layers forming a main thyristor portion;

said bulk ($N_1$), first ($P_1$) second ($P_2$) and auxiliary cathode emitter ($N_3$) layers forming an auxiliary thyristor portion;

a biasing power source (13) connected between said cathode electrode (K) and said second gate electrode ($G_2$) for making a current flow from said biasing power source to said main cathode emitter layer ($N_2$), said second layer ($P_2$) and said second gate electrode ($G_2$) and for turning said main thyristor portion off;

a diode (16) connected between said cathode electrode and said auxiliary electrode (10) for making a current flow from said biasing power source to said auxiliary cathode emitter layer ($N_3$), said second layer ($P_2$) and said second gate electrode ($G_2$) for simultaneously turning said main thyristor portion and said auxiliary thyristor portion off; and a resistor (15) provided between said second electrode ($G_2$) and said auxiliary electrode (10) for applying a reverse bias to said auxiliary thyristor portion during turning of said main thyristor portion on.

2. A device according to claim 1, wherein said resistor is an external resistor connected between said auxiliary electrode and said second gate electrode.

3. A device according to claim 1, wherein said second layer includes a groove defined therein disposed around and spaced from said main cathode emitter layer, said second gate electrode disposed at the top of said groove.

4. A device according to claim 3, wherein said groove and said gate electrode are comb-shaped, said device having a plurality of said main cathode emitter layers disposed between teeth of said comb-shaped groove and second gate electrode.

5. A device according to claim 3 including a plurality of said main cathode emitter layers, said groove having an annular portion surrounding said plurality of said main cathode emitter layers, and a plurality of radially extending portions extending between each of said plurality of main cathode emitter layers, said auxiliary cathode emitter layer disposed radially inwardly of said groove and said first gate electrode disposed radially inwardly of said auxiliary cathode emitter layer.

* * * * *